(12) United States Patent
Schrems et al.

(10) Patent No.: US 11,452,199 B2
(45) Date of Patent: Sep. 20, 2022

(54) ELECTRONIC MODULE WITH SINGLE OR MULTIPLE COMPONENTS PARTIALLY SURROUNDED BY A THERMAL DECOUPLING GAP

(71) Applicant: AT&S Austria Technologie & Systemtechnik Aktiengesellschaft, Leoben (AT)

(72) Inventors: Martin Schrems, Höf-Präbach (AT); Markus Leitgeb, Trofaiach (AT); Steve Anderson, Gilbert, AZ (US)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/569,429

(22) Filed: Sep. 12, 2019

(65) Prior Publication Data

US 2021/0084747 A1 Mar. 18, 2021

(51) Int. Cl.
*H05K 1/02* (2006.01)
*H05K 1/11* (2006.01)
(Continued)

(52) U.S. Cl.
CPC .......... *H05K 1/0204* (2013.01); *H05K 1/114* (2013.01); *H05K 1/145* (2013.01); *H05K 1/18* (2013.01);
(Continued)

(58) Field of Classification Search
CPC .. H05K 1/0204; H05K 3/4611; H05K 3/3431; H05K 1/114; H05K 1/145; H05K 2203/1105; H05K 2201/10159
See application file for complete search history.

(56) References Cited

U.S. PATENT DOCUMENTS

| 5,410,451 A | 4/1995 | Hawthorne et al. |
| 5,661,339 A | 8/1997 | Clayton |

(Continued)

FOREIGN PATENT DOCUMENTS

| KR | 20150025633 A | 3/2015 |
| RU | 2 643 941 C1 | 2/2018 |

(Continued)

OTHER PUBLICATIONS

Ravichandran et al., "What's New in Packaging @ Georgia Tech? Wafer Fan-Out is a Great Success. What Next?", Apr. 13, 2018, Atlanta, Georgia U.S.A. as found at http://prc.gatech.edu/hg/item/605078 on Sep. 13, 2019.

(Continued)

*Primary Examiner* — Ishwarbhai B Patel
(74) *Attorney, Agent, or Firm* — Robert A. Blaha; Smith Tempel Blaha LLC

(57) ABSTRACT

An electronic device including a first component carrier, a second component carrier connected with the first component carrier so that a thermal decoupling gap is formed between the first component carrier and the second component carrier, a first component on and/or in the second component carrier, and a second component having a first main surface mounted in the thermal decoupling gap so that at least part of an opposing second main surface and an entire sidewall of the second component is exposed with respect to material of the first component carrier and with respect to material of the second component carrier.

20 Claims, 11 Drawing Sheets

(51) Int. Cl.
*H05K 1/14* (2006.01)
*H05K 3/46* (2006.01)
*H05K 1/18* (2006.01)
*H05K 3/34* (2006.01)

(52) U.S. Cl.
CPC ............ *H05K 1/181* (2013.01); *H05K 3/3431* (2013.01); *H05K 3/4611* (2013.01); *H05K 1/11* (2013.01); *H05K 1/185* (2013.01); *H05K 2201/10159* (2013.01); *H05K 2203/1105* (2013.01)

(56) References Cited

U.S. PATENT DOCUMENTS

| | | | |
|---|---|---|---|
| 6,049,975 | A | 4/2000 | Clayton |
| 6,613,413 | B1 | 9/2003 | Japp et al. |
| 6,754,551 | B1 | 6/2004 | Zohar et al. |
| 6,864,434 | B2 * | 3/2005 | Chang ............... H01L 23/49822 174/255 |
| 6,921,451 | B2 | 7/2005 | Wilhelm |
| 7,796,399 | B2 | 9/2010 | Clayton et al. |
| 8,153,902 | B2 * | 4/2012 | Nakamura ............ H05K 1/0271 174/254 |
| 9,324,696 | B2 | 4/2016 | Choi et al. |
| 2002/0027019 | A1 * | 3/2002 | Hashimoto ........ H01L 23/49805 174/260 |
| 2004/0036164 | A1 * | 2/2004 | Koike ................. H01L 25/0657 257/723 |
| 2008/0211079 | A1 * | 9/2008 | Onodera ............. H01L 25/105 257/686 |
| 2010/0025833 | A1 * | 2/2010 | Pagaila .................. H01L 24/97 257/686 |
| 2011/0294315 | A1 * | 12/2011 | Kawabata ............ G06K 7/0078 439/81 |
| 2012/0074586 | A1 | 3/2012 | Seo et al. |
| 2014/0131894 | A1 | 5/2014 | Yu et al. |
| 2015/0102484 | A1 * | 4/2015 | Chen ................ H01L 23/49833 257/737 |
| 2015/0206862 | A1 | 7/2015 | Opiniano |
| 2016/0105957 | A1 | 4/2016 | Tomikawa et al. |
| 2016/0192525 | A1 * | 6/2016 | Hu ..................... H01L 23/5389 361/736 |
| 2016/0351522 | A1 | 12/2016 | Gong et al. |
| 2018/0337160 | A1 | 11/2018 | Drab et al. |
| 2019/0148304 | A1 * | 5/2019 | Gavagnin .............. H01L 22/14 257/773 |

FOREIGN PATENT DOCUMENTS

| | | |
|---|---|---|
| WO | 03/069376 A2 | 8/2003 |
| WO | 2019102522 A1 | 5/2019 |

OTHER PUBLICATIONS

Goethals, F.; Partial European Search Report in Application No. 20192056.8; pp. 1-14; dated May 19, 2021; European Patent Office; 80298, Munich, Germany.

Goethals, F.; Partial European Search Report in Application No. 20192056.8; pp. 1-17; dated Sep. 23, 2021 European Patent Office; 80298, Munich, Germany.

\* cited by examiner

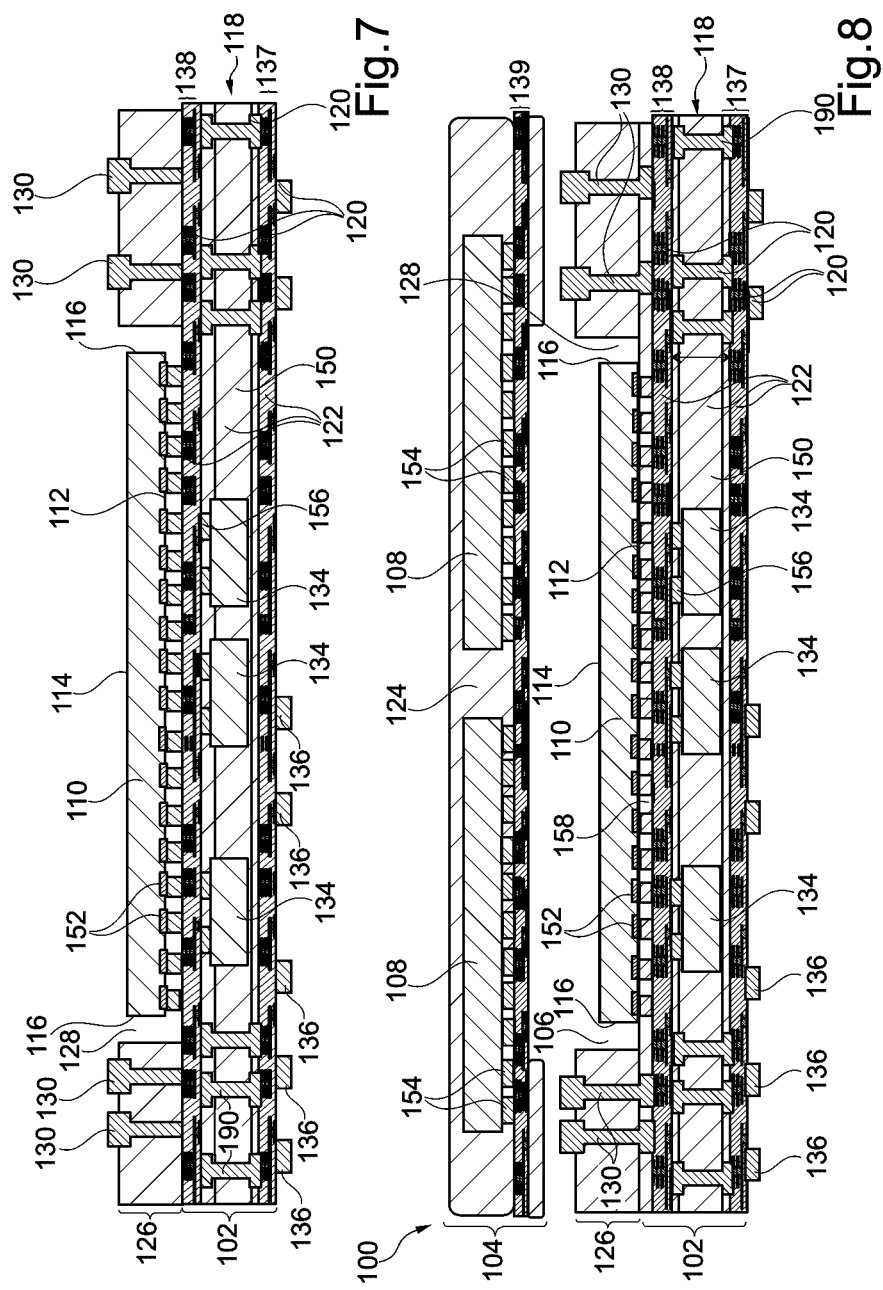

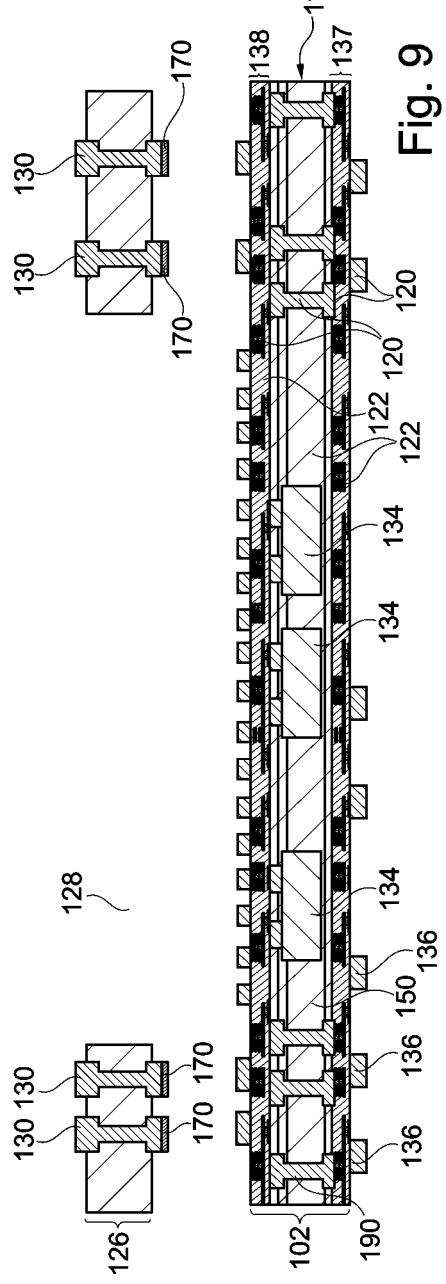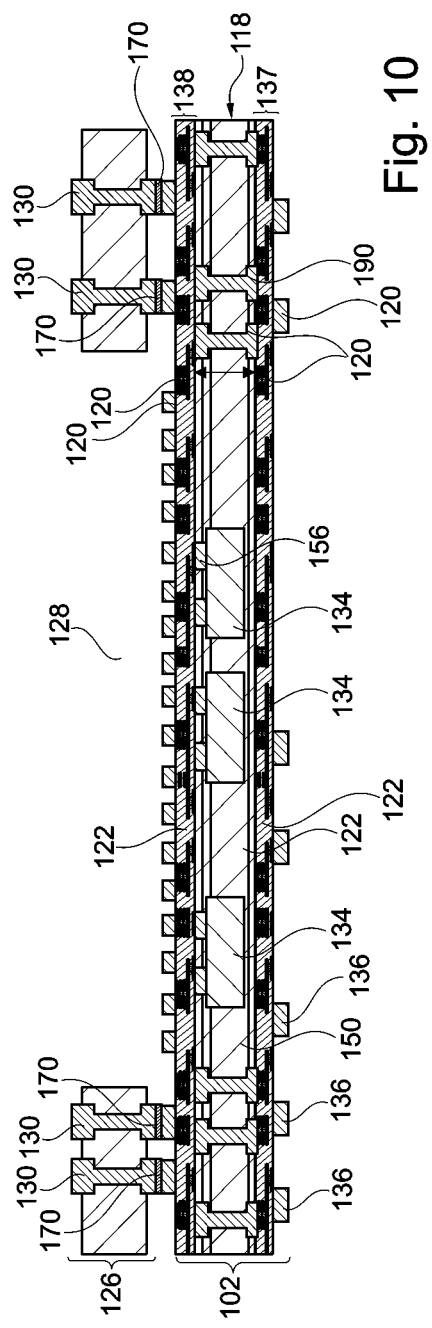

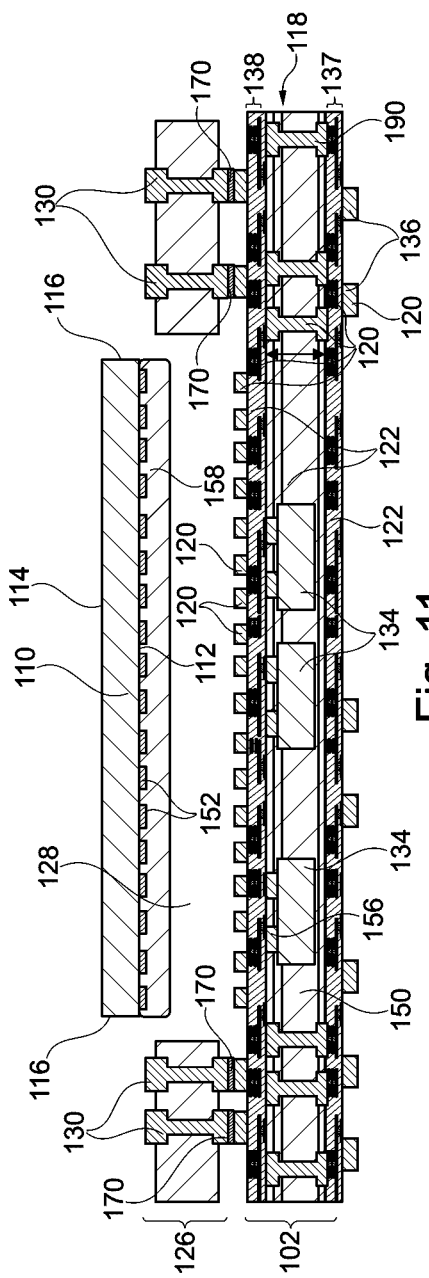
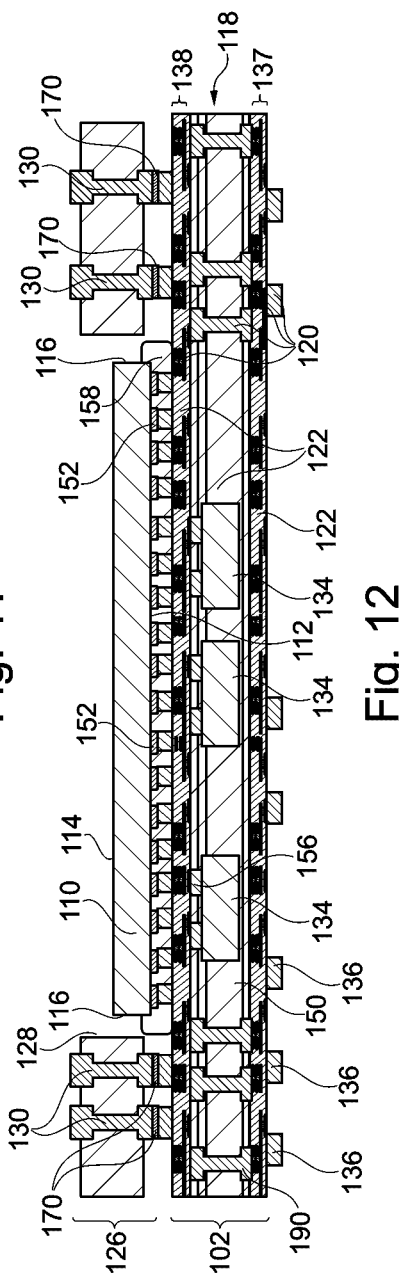
Fig. 11
Fig. 12

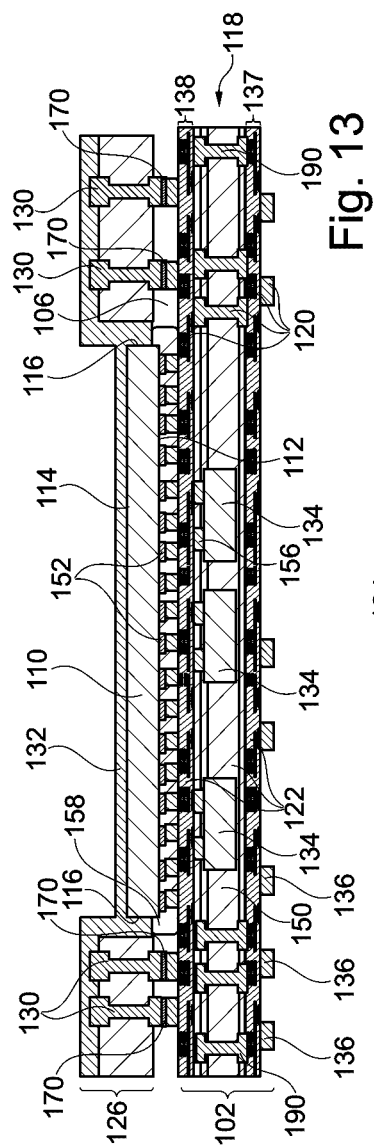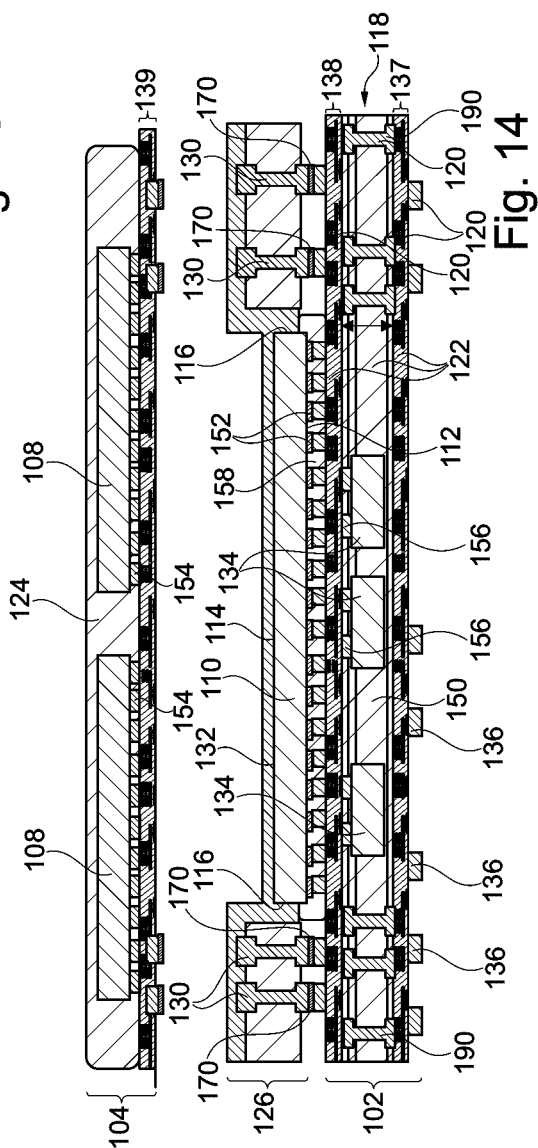

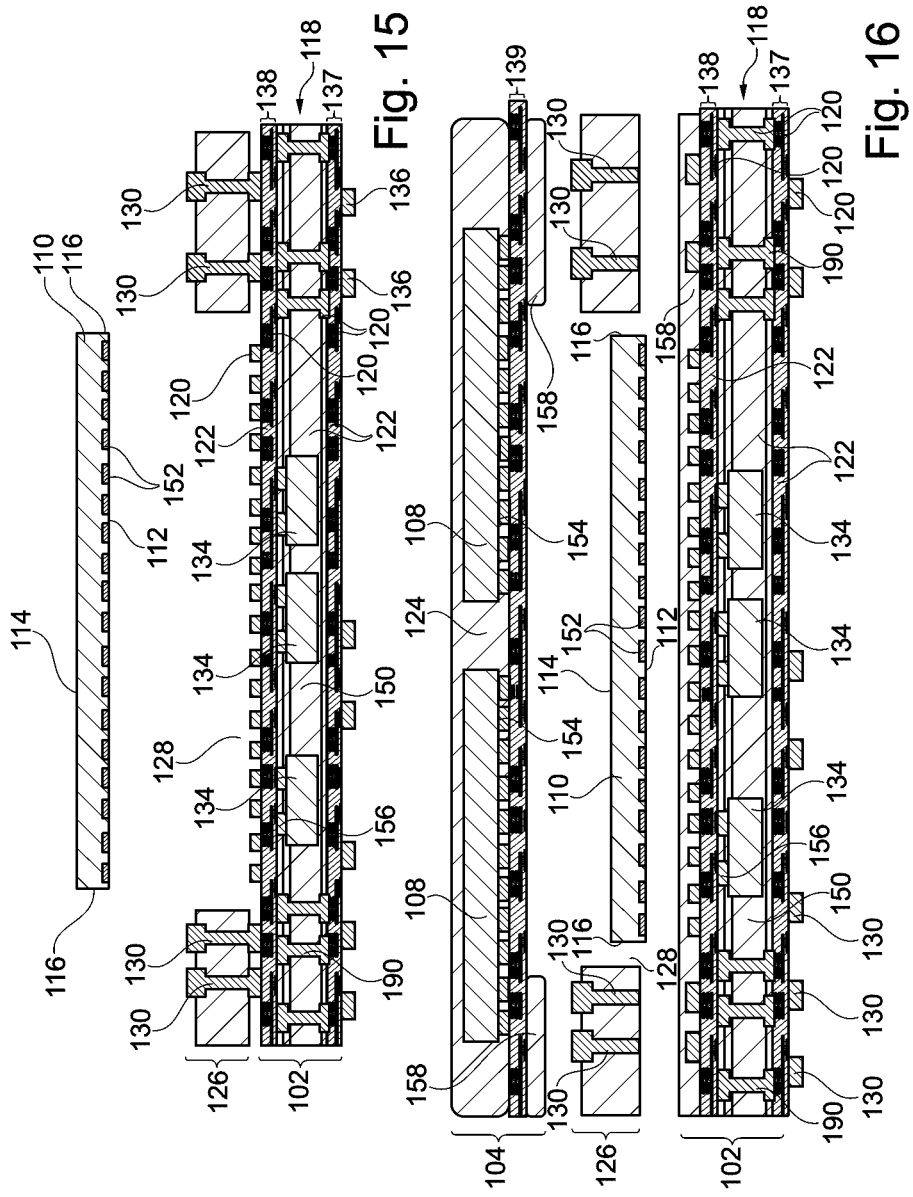

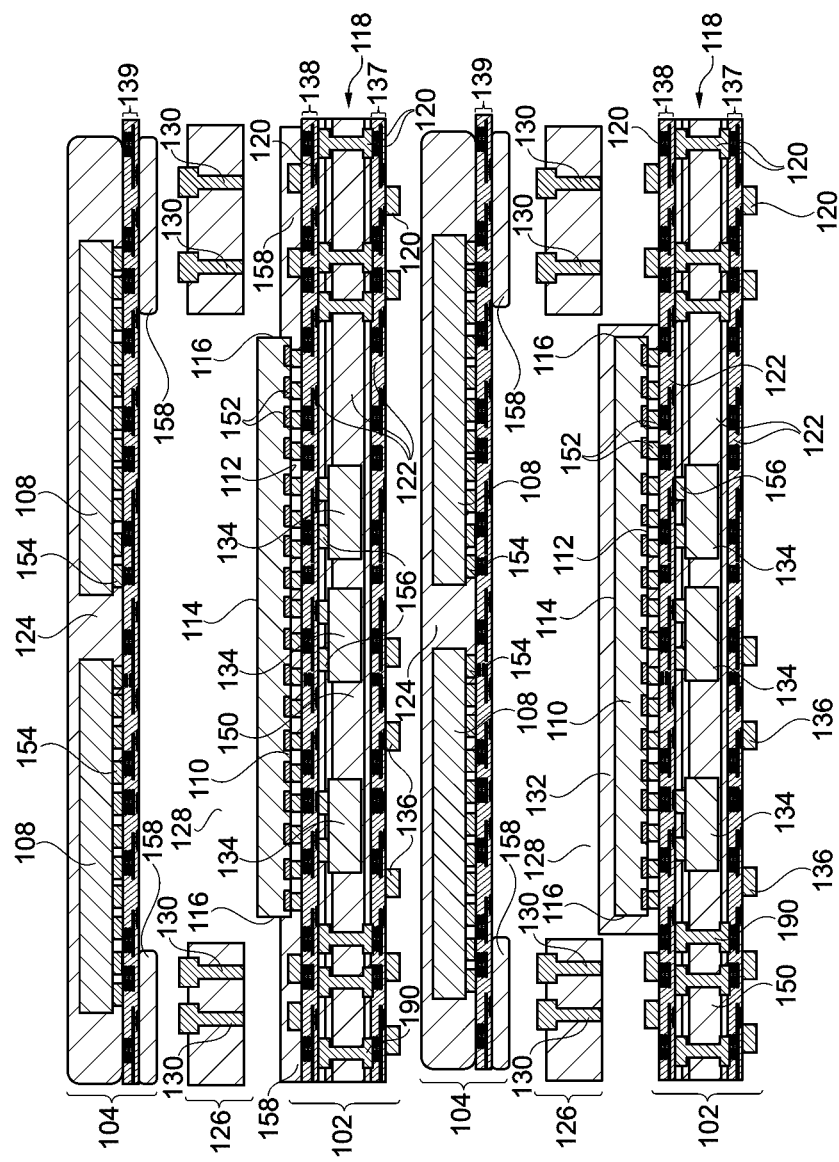

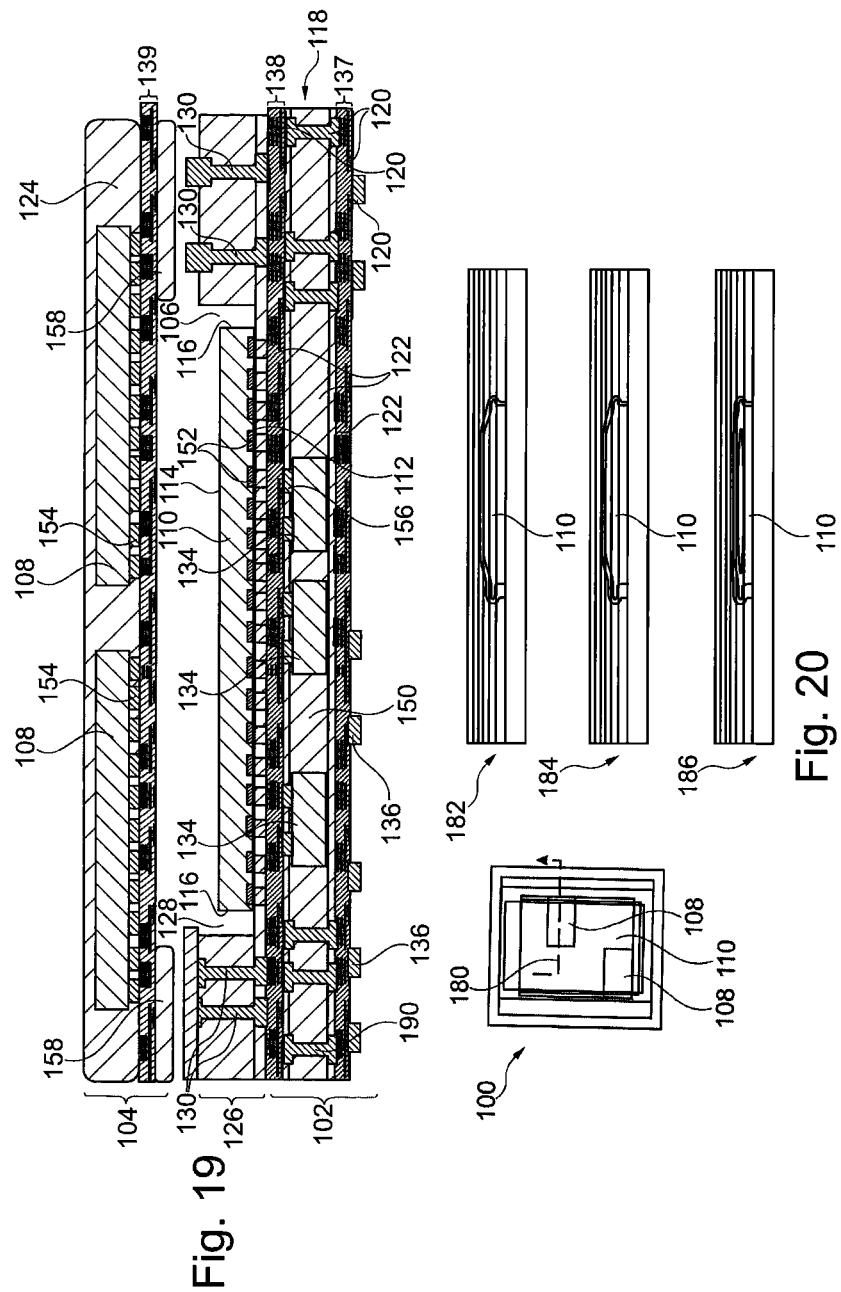

ELECTRONIC MODULE WITH SINGLE OR MULTIPLE COMPONENTS PARTIALLY SURROUNDED BY A THERMAL DECOUPLING GAP

TECHNICAL FIELD

The invention relates to an electronic device and to a method of manufacturing an electronic device.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. At the same time, component carriers shall be mechanically robust and electrically reliable so as to be operable even under harsh conditions. It is also desirable that component carriers are compatible with the processing of high-frequency signals.

SUMMARY

There may be a need for a simply manufacturable electronic device with multiple components and high thermal performance.

According to an exemplary embodiment, an electronic device is pro-vided which comprises a first component carrier, a second component carrier connected with the first component carrier so that a thermal decoupling gap is formed between the first component carrier and the second component carrier, a first component on and/or in the second component carrier, and a second component having a first main surface mounted in the thermal decoupling gap so that at least part of an opposing second main surface and an entire sidewall of the second component is exposed with respect to material of the first component carrier and with respect to material of the second component carrier.

According to another exemplary embodiment, a method of manufacturing an electronic device is provided, wherein the method comprises providing a first component carrier, providing a second component carrier with a first component (which may be an embedded component or a surface mounted component), connecting the second component carrier with the first component carrier so that a thermal decoupling gap is formed between the first component carrier and the second component carrier, and mounting a first main surface of a second component in the thermal decoupling gap so that at least part of an opposing second main surface and at least part of an entire sidewall of the second component is exposed with respect to material of the first component carrier and with respect to material of the second component carrier.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "component" may particularly denote an inlay-type member. Such a component may be arranged in particular in an interior of or on the first component carrier and/or the second component carrier, respectively. A component may in particular have an electronic function and may thus be a heat source in view of ohmic losses. For instance, such a component may be a semiconductor die.

In the context of the present application, the term "thermal decoupling gap" may particularly denote a cavity in an interior of the electronic device which cavity has a portion being thermally insulating. For instance, such a cavity may be not filled with solid material, but may be empty or gas filled (in particular air filled). Thus, a thermal decoupling gap may for example be an air gap. In particular, a thermal decoupling gap type cavity between first component carrier and second component carrier may be partially filled with the second component and may remain partially unfilled. In certain embodiments, the thermal decoupling gap may be embodied as or may be denoted as a thermal decoupling structure, a heat decoupling gap, a buffer gap, or an insulation gap.

According to an exemplary embodiment, an electronic device or module is provided which comprises a first component carrier (such as a substrate or a printed circuit board) and a second component carrier (such as a further substrate or a further printed circuit board) with at least one encapsulated or surface mounted first component. Between the first component carrier and the second component carrier, at least one second component is sandwiched, however with a thermal decoupling gap in between. More specifically, the at least one second component is exposed with respect to material of the second component carrier and with respect to material of the first component carrier both at one main surface (opposing a mounting surface) and at entire sidewalls of the at least one second component. By taking this measure, a reliable thermal decoupling between the at least one second component (for instance a heat source such as a processor chip) and the at least one first component (for instance a heat sensitive unit such as a memory chip) may be ensured. Highly advantageously, both thermal paths between the first and second components along a vertical direction as well as along a lateral direction may be interrupted by the thermally insulating thermal decoupling gap with the mentioned properties. This prevents undesired heating of the at least one first component by the at least one second component, or vice versa. Simulations have confirmed that an airgap has an advantageously pronounced impact on the thermal decoupling between first and second components. Thus, the components may be safely prevented from failure or damage while simultaneously maintaining a compact configuration of the electronic device.

In the following, further exemplary embodiments of the electronic device and the method will be explained.

A gist of an exemplary embodiment is the provision of a vertical and lateral thermal decoupling gap for thermal isolation of at least one first component (in particular memory chips) encapsulated in or surface mounted on a second component carrier from at least one second component (in particular a processor) arranged between two component carriers (such as a PCB or an IC substrate). By taking this measure, it is in particular possible that heat created by the second component (in particular processor heat) can be removed to a bottom side via vertical connections and/or thermally conductive plates (preferably made of copper), i.e. away from the one or more first components. In case the materials of the first component carrier and the second component carrier do not provide sufficient protection of the components (in particular semiconductor dies) against an environment (for instance protection against moisture), one or more of the components can be sealed or at least partially covered with an additional coating or barrier layer (for instance made of parylene, polytetrafluoroethylene (PTFE)) coating while maintaining the thermal decoupling gap or cavity for thermal isolation. Exemplary embodiments also provide methods and structures for additional component embedding to simultaneously solve issues in terms of vertical height or module thickness. An electrical and thermal performance improvement may be achieved as well as a reliability improvement. Exemplary embodiments are especially useful to combine a thermally isolating and thermally channelling thermal decoupling gap with a proper thermal management and with embedding of components to keep the vertical height of the electronic device small. An electronic device (for example a package-on-package, PoP, structure) according to exemplary embodiments may use a backside cavity of a top substrate or package or an additional connection body (such as a spacer frame) with integrated (for instance through) hole or opening for defining the thermal decoupling gap. Descriptively speaking, the connection body may function as an electromechanical interconnection. It is also possible to implement a layer bonding method (for instance thermo-compression bonding of copper pads with or without solder caps) to streamline the manufacturing process and keep the vertical thickness of the electronic device small.

Embodiments provide a method and an electronic device to thermally isolate a first component (for instance a memory chip) on the top of the electronic device from another second component (for example a processor or heat source) on the bottom side of the first component, and to ensure heat removal along lateral and vertical heat removal paths for avoiding undesired overheating of said components. Additionally, the electronic device is capable of reducing a height in vertical direction by optionally embedding of at least one further component (for instance a power management integrated circuit, one more passive components, etc.) in the first component carrier. In particular, a thermal decoupling gap may be formed vertically and laterally of the second component arranged between the first component carrier and the second component carrier for thermal isolation of the first component (such as a memory). Height of the electronic device may be very small while maintaining also a small footprint of the electronic device in a horizontal plane, to keep the space small which is consumed by the electronic device on a mounting base (such as a PCB mainboard). By a chip-last manufacturing process connecting chip type components (for instance processor, memory) as late as possible during the manufacturing process, high yield at low effort may be achieved.

In an embodiment, the first main surface of the second component is mounted on the first component carrier. When mounted on the first component carrier which is to be mounted, in turn, on a mounting base such as a motherboard PCB, the mechanical connection of the second component may simultaneously also establish a vertically short electrical connection with the first component carrier.

In an embodiment, the first component carrier comprises a connected, in particular laminated, stack comprising at least one electrically conductive layer structure and/or at least one electrically insulating layer structure. In the context of the present application, the term "layer structure" may particularly denote a continuous layer, a patterned layer or a plurality of non-consecutive islands within a common plane. The configuration of the first component carrier as a laminated stack may provide a stable bottom portion of the electronic device as well as providing proper electric connections with low effort and high compactness in vertical direction. Providing the first component carrier as a laminated stack may also allow embedding components therein with small space consumption for further increasing the thickness of the electronic device.

In an embodiment, the first component is embedded in a mold compound on the second component carrier. By encapsulating the first component by molding, the second component carrier may be manufactured with low effort. In particular, a set of first components may be mounted on top of a second set of components to form a single three-dimensional package. Said first and said second components may be at least partially separated by a cavity, i.e. a thermal decoupling gap.

In an embodiment, the second component carrier comprises a connected (in particular laminated) stack comprising at least one electrically conductive layer structure and/or at least one electrically insulating layer structure, wherein the first component is embedded in the stack or is surface mounted on the stack. Thus, the second component carrier may alternatively be provided as a laminated package, for instance a PCB.

In an embodiment, the entire second main surface of the component is exposed with respect to material of the first component carrier and with respect to material of the second component carrier. This may ensure a particularly pronounced thermal decoupling between first component(s) and second component(s).

In an embodiment, at least one of the first component and the second component is a semiconductor chip. Semiconductor chips or dies are particularly thin in a vertical direction and may therefore contribute to the contact design of the electronic device in vertical direction. However, the first and second components may also be other components, such as passive components (for instance manufactured in ceramic technology).

In an embodiment, the first component is a memory chip for storing data. Multiple such memory chips may be arranged side-by-side and/or vertically stacked. Memory chips may be sensitive to overheating, but can be reliably protected against excessive heating from heat generated by a processor type second component by said thermal decoupling gap and/or by an appropriate channelling of heat generated by the second component away from the top side first component(s) and towards a bottom side first component carrier. However, in another embodiment, the first component may be one or more image sensors or any other kind of sensor (for instance a gas sensor) which can be exposed to an environment.

In an embodiment, the second component is a processor chip. Such a processor chip may be a significant heat source during operation of the electronic device. However, such heat may be efficiently removed from the electronic device to a bottom side by one or more redistribution layers and electrically conductive layer structures of the first component carrier. Excessive propagation of such heat upwardly to the one or more first components of the second component carrier may be prevented by the described thermal decoupling gap configuration.

In an embodiment, the second component carrier comprises a recess at a side facing the first component carrier for at least partially accommodating the second component and delimiting the thermal decoupling gap. Such a recess may allow accommodating the second component therein, while maintaining a thermally insulating thermal decoupling gap. Closing (in particular hermetically closing) of such a recess may be accomplished by the first component carrier closing the recess from a bottom side. A correspondingly formed cavity may serve simultaneously for accommodating the second component and for providing the thermal decoupling gap.

In an embodiment, the electronic device comprises a connection body connected between the first component carrier and the second component carrier and having an opening (in particular a through hole, alternatively a blind hole, or a hole to an outside) at least partially accommodating the second component and delimiting or supplementing the thermal decoupling gap. For instance, such a connection body may be manufactured in PCB or substrate technology, i.e. may be a laminate with a central hole. This may allow precisely defining the thermal decoupling gap while simultaneously enabling manufacture of the connection body with low effort. For instance, the connection body may be ring-shaped or annularly shaped.

In an embodiment, the connection body comprises at least one vertical through connection filled with an electrically conductive material and electrically coupling the first component with the second component. Such a vertical through connection may be a copper filled via, in particular formed by laser drilling or mechanically drilling and filled with electrically conductive material by plating. With such one or more vertical through connections, an electric connection between first component carrier, second component carrier and the components may be accomplished without excessive heat flow from the second component to the first component during operation.

In an embodiment, the electronic device comprises a coating (such as a thin film) at least partially coating an exposed surface of the second component. For instance, the coating may comprise a thermally highly conductive coating (such as copper) and/or a protective coating (for instance an anticorrosive coating such as a hydrophobic coating, a migration inhibiting coating, a chemical-resistive or gas-resistive coating, a high breakdown voltage protection coating, an electrostatic discharge (ESD) coating, etc.). For example, an anticorrosive coating may avoid corrosion and chip contamination, for instance in case of an open cavity. By coating the second component with an anticorrosive material, undesired contamination of the second component with moisture may be reliably prevented. The former may promote heat removal from the second component to avoid overheating thereof. Coating the second component with a thermally highly conductive material such as copper may thus allow efficiently removing heat from the second component preferably predominantly via the first component carrier on the bottom side. This may prevent undesired overheating of the second component with low effort.

In an embodiment, at least part of sidewalls of the connection body, which sidewalls delimit the thermal decoupling gap, comprise a coating. Such a coating may be provided additionally or alternatively to a coating of the second component. Coating the sidewalls of the connection body (instead of or in addition to coating the second component itself) may increase the freedom of design of a circuit designer. The coating of the sidewalls of the connection body may be functionalized in a corresponding way as described above for the coating of the second component, i.e. may be in particular a thermally highly conductive coating and/or an anticorrosive coating. For instance, the sidewalls can be a continuous metal ring which aids to improve the thermal performance.

Preferably, an additional metallization may cover sidewall and top of the processor package for a lateral and a sidewall-based heat spreading or heat removal.

In an embodiment, the electronic device comprises at least one third component embedded in the first component carrier. Embedding such at least one further third component in the first component carrier rather than surface mounting at least one additional third component on the first component carrier may contribute to the compact vertical design of the electronic device. Moreover, this may promote a performance improvement, an improvement in terms of power delivery (for instance de-coupling caps), and/or a reliability improvement.

In an embodiment, the third component comprises at least one of the group consisting of a passive component and a power supply controller. For instance, such a passive component may be a capacitor, an inductance, a resistor, an integrated passive device (IPD) or an antenna. A power supply controller may for instance regulate a voltage supply in accordance with requirements of one or more semiconductor dies of the electronic device. It is also possible that the third component is an active component.

In an embodiment, the electronic device comprises one or more fourth components embedded in the above-described connection body. For instance, the fourth component may comprise a passive component, such as a capacitor. With such embodiments, it is possible to efficiently use also otherwise unused regions of the connection body for embedding one or more additional components, to thereby further decrease the space consumption of the device.

In an embodiment, the second component carrier comprises a plurality of first components embedded in and/or surface mounted on the second component carrier. At least part of said first components may be arranged side-by-side, to thereby promote a compact vertical construction of the electronic device. Additionally or alternatively, some of the third components may be stacked (preferably directly stacked), so as to obtain high functionality with limited space consumption.

In an embodiment, the first component carrier comprises at least one pillar (such as at least one copper pillar) at an exposed main surface for establishing and electric connection of the electronic device with a mounting board. Highly advantageously, such a pillar may involve a significantly lower contribution to the vertical thickness of the electronic device than a bulky solder bump. Although a solder bump may be used in other embodiments, accomplishing an electric connection by a pillar (in particular a copper pillar) may be a preferred option for obtaining a compact configuration.

In an embodiment, the first component carrier comprises a redistribution layer on an exposed main surface. Additionally or alternatively, the first component carrier may comprise a further redistribution layer at a main surface facing the second component. Such redistribution layers may fulfil two functions. Firstly, such one or more redistribution layers may redistribute an electric connection structure and may therefore serve for a fan out of signals. In other words, a redistribution layer may be an electrically conductive transfer structure transferring between the smaller dimensions of the chip world and the larger dimensions of the PCB world. Secondly, such one or more redistribution layers may also contribute to heat removal away from the second component (which may be the most significant heat source in an embodiment of the electronic device) and predominantly away from the one or more first components, and may therefore contribute to a bottom side channelling of heat.

In an embodiment, the second component carrier comprises a redistribution layer at a main surface facing the first component carrier. A further redistribution layer on a bottom side of the second component carrier may ensure a proper electric coupling between the first component carrier and the second component carrier, optionally through a connection body.

In an embodiment, at least one of the one or more redistribution layers of the first component carrier may have a volume percentage of copper of at least 1 volume percent, in particular at least 10 volume percent, more particularly at least 50 volume percent. Descriptively speaking, the higher the copper content of the one or more redistribution layers of the first component carrier, the larger the heat removal capability of the respective redistribution layer, since copper has an extraordinarily high capability of conducting heat. With the mentioned significant copper contributions, heat removal from the second component out of the electronic device may be strongly promoted, while simultaneously reducing the risk of overheating of the one or more first components due along a thermal path in an upward direction. In order to obtain said advantageous effects, it may also be advantageous when the first component carrier comprises at least one redistribution layer having an effective thermal conductivity in a horizontal plane in a range from 5 W/mK to 20 W/mK, in particular in a range from 10 W/mK to 15 W/mK. The mentioned values of the thermal conductivity may relate to a homogenized or an averaged thermal conductivity, i.e. an effective thermal conductivity provided by the conductive and non-conductive material. Additionally or alternatively, the first component carrier may comprise at least one redistribution layer having an effective thermal conductivity in a vertical direction in a range from 2 W/mK to 10 W/mK, in particular in a range from 3 W/mK to 8 W/mK. For the avoidance of doubt, the thermal conductivity numbers are just for illustrative purposes. Actual numbers according to embodiments of this invention can also be higher or lower. For example, the thermal conductivity of the redistribution layers may be dominated by copper having a significantly higher value of the thermal conductivity as compared to dielectric laminate materials such as epoxy resin or polyimide. Descriptively speaking, thermal conductivity may be larger in the horizontal plane of the first component carrier as compared to its thickness direction, since a significant portion of the copper material of the redistribution layer may be provided in form of planar patterned copper foils having in many cases a higher amount of copper material as compared to vertical through connections of copper, such as copper filled laser vias.

In an embodiment, the first component carrier comprises a heat removal structure between the first main surface of the second component and an exposed main surface of the first component carrier for removing heat from the second component through the exposed main surface of the first component carrier. Heat can be efficiently removed out of an interior of the electronic device through a well-controlled path in a downward direction, i.e. from the second component towards the first component carrier rather than propagating predominantly upwardly to the first component(s). Descriptively speaking, the thermal decoupling gap may face the second component carrier rather than the first component carrier for this purpose. In particular, the heat removal structure may be formed by at least one electrically unconnected vertical through connection of the first component carrier, filled with a thermally conductive material (such as copper). By such one or more additional thermal vias without electrical function in the bottom processor board an improved heat removal performance may be achieved.

In an embodiment, the method comprises mounting the first main surface of the second component on the first component carrier directly or immediately before connecting the first component carrier with the second component carrier. Thus, a manufacture of the electronic device may be based on a chip-last principle, in particular what concerns the in many cases highly expensive second component.

For instance, the method may comprise coating the second component with a coating after mounting the second component on the first component carrier. For example, coating the second component may be accomplished by sputtering, physical vapor deposition (PVD), chemical vapor deposition (CVD), or any other appropriate deposition process.

In an embodiment, the method comprises connecting the first component carrier and the second component carrier, optionally with a connection body in between, by thermo-compressing. Thermo-compression bonding may correspond to a bonding of two metallic structures which may be brought into atomic contact, in particular by applying force and heat simultaneously. A diffusion which occurs in terms of thermo-compression bonding is promoted by an atomic contact between the surfaces due to an atomic motion. An atomic interaction may stick the interface together. Thermo-compression bonding may be provided by a nonconductive film provided between the two connection surfaces. Correspondingly, the method may comprise connecting the first component carrier and the second component by thermo-compressing.

In an embodiment, the first component carrier and/or the second component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the first component carrier and/or the second component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board. A plate-shaped component carrier also ensures short electric connection paths, and therefore suppresses signal distortion during transport.

In an embodiment, the first component carrier and/or the second component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier, which may for example have substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, land side caps (LSC) and/or die side caps (DSC), with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene. This may refer to a core and/or to one or more build-up layers.

In an embodiment, any of the above mentioned electrically insulating layer structures comprises at least one of the group consisting of resin (such as reinforced or non-reinforced resins, for instance epoxy resin or Bismaleimide-Triazine resin), cyanate ester, polyphenylene derivate, glass (in particular glass fibers or spheres, multi-layer glass, glass-like materials), prepreg material (such as FR-4 or FR-5), polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imageable dielectrics may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, any of the above mentioned electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, any of the above mentioned electronic components may be an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens) an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the first component carrier and/or the second component carrier is a laminate-type component carrier. In such an embodiment, the component carrier is a compound of multiple layer structures which are stacked and connected together by applying a pressing force and/or heat.

After processing interior layer structures of the first component carrier and/or the second component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are OSP (Organic Solderability Preservative), Electroless Nickel Immersion Gold (ENIG), gold (in particular Hard Gold), chemical tin, nickel-gold, nickel-palladium, etc. Examples for appropriate materials for a surface finish in particular for IC substrates are Electroless Nickel Electroless Palladium Immersion Gold (ENEPIG), Electroless Nickel Immersion Palladium Immersion Gold (ENIPIG) and plated tin. Further examples for appropriate materials for a surface finish in particular for printed circuit boards are nickel-free surface finishes, for instance Electroless Palladium Autocatalytic Gold (EPAG) and Immersion Silber Immersion Gold (ISIG).

BRIEF DESCRIPTION OF THE DRAWINGS

FIG. 7 illustrates a cross-sectional view of a bottom portion of an electronic device according to another exemplary embodiment.

FIG. 8 illustrates a cross-sectional view of constituents of an electronic device according to an exemplary embodiment before connection.

FIG. 9, FIG. 10, FIG. 11, FIG. 12, FIG. 13, FIG. 14, FIG. 15, FIG. 16, FIG. 17, FIG. 18 and FIG. 19 illustrate cross-sectional views of structures obtained during carrying out a method of manufacturing an electronic device according to an exemplary embodiment.

FIG. 20 illustrates simulation results of an electronic device according to an exemplary embodiment and shows improved thermal decoupling between a component in a second component carrier and another component in a thermal decoupling gap.

DETAILED DESCRIPTION OF ILLUSTRATED EMBODIMENTS

Figure 1:
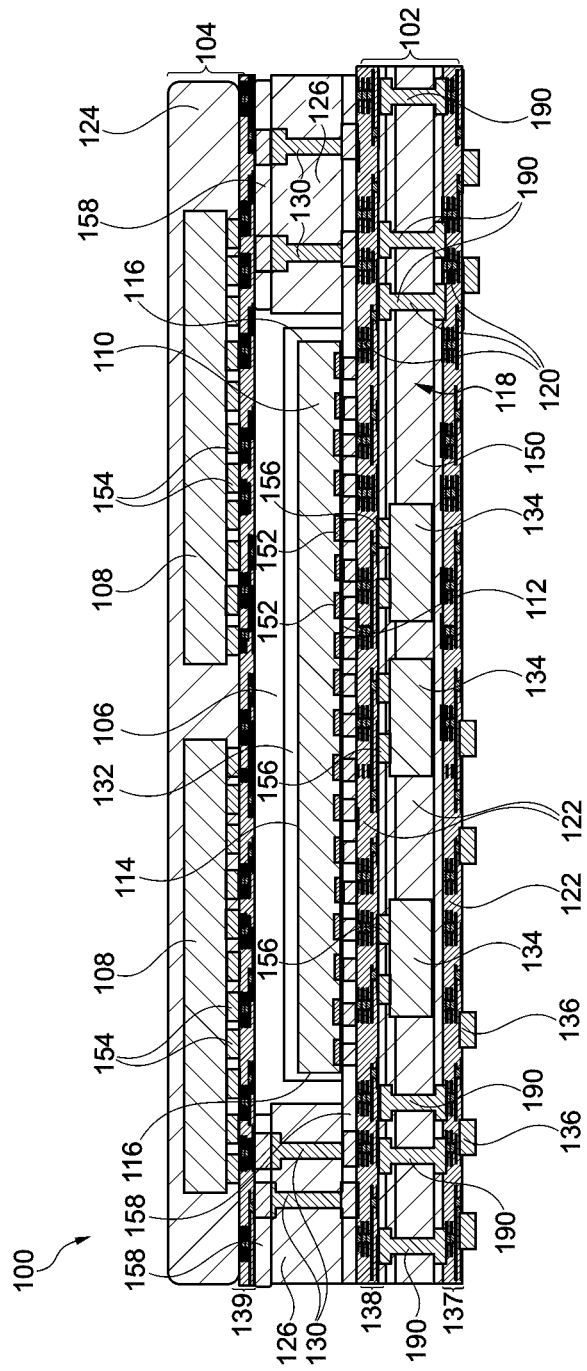
FIG. 1 illustrates a cross-sectional view of an electronic device according to an exemplary embodiment.

The aspects defined above and further aspects of the invention are apparent from the examples of embodiment to be described hereinafter and are explained with reference to these examples of embodiment.

The illustrations in the drawings are schematically presented. In different drawings, similar or identical elements are provided with the same reference signs.

Before referring to the drawings, exemplary embodiments will be de-scribed in further detail, some basic considerations will be summarized based on which exemplary embodiments of the invention have been developed.

Conventional Package-on-Package (PoP) structures, in particular for mobile phones, have two major architectures. Application processors may be based on Wafer Level Packaging processing using materials and processes from the back end of line semiconductor industry. These materials (i.e. epoxy mold compound) are limited in thermal conductivity and add different functions to the package (for instance electromagnetic shielding, signal stabilization, power supply). The second type has a flip-chip mounted processor on a substrate, for instance plus an overmolding for protection. Due to high number of input and/or output terminals of semiconductor chips usually used for said processor, these substrates may be made with ABF (Ajinomoto Build-up Film) using a semi-additive Process. In both cases the processor is fully encapsulated by molding material, which shows a poor thermal conductivity. Therefore, the heat that is generated during the operation of the processor can be transferred easily to the top component carrier, usually including a memory, and vice versa. Additionally, further miniaturization within the second component carrier and improvement in power delivery is required as well. The lateral space is limited so the integrated circuit components have to be stacked in a Package-on-Package which may in turn increase the vertical height. Moreover, it may also be desirable to provide an electronic device where the most expensive components (for instance processor, memory) can be integrated late during the manufacturing proceedings, in particular in a chip-last fashion, to avoid yield risks and associated losses.

According to an exemplary embodiment, an electronic device (for in-stance configured as a package on package structure) is provided which has a thermal decoupling gap between a top side component carrier and a bottom side component carrier for providing a thermal isolation between vertically spaced components both in a lateral and vertical direction and ensuring heat removal along desired vertical and lateral directions. Such heat removal paths may be oriented preferably away from the components, thereby avoiding unwanted heating of components. Preferably, the thermal decoupling gap may be vertically arranged between the components, i.e. may vertically face away from the first component carrier. The thermal decoupling gap may also circumferentially surround the entire sidewalls of the component accommodated within the thermal decoupling gap so as to further promote removal of heat in a downward direction towards the first component carrier rather than in an upward direction towards components embedded in the second component carrier.

Additionally, exemplary embodiments may provide thermal (for example copper) vias and (for example copper) lines for promoting heat removal in desired directions. Therefore, both bottom and top component carriers can be separated thermally, and as a result performance of the electronic device may be improved. In case the first component carrier (for instance a PCB or an IC substrate) and the second component carrier do not provide suitable protection of the components against undesired influences from an environment (for instance moisture), the corresponding one or more components can be sealed with an additional coating or barrier layer while maintaining the air cavity for thermal isolation. By embedding rather than surface mounting the components in an interior of the electronic device, the com-pact configuration can be further enhanced. By embodying connection terminals at a bottom side of the electronic device for electric connection to an electronic environment (for instance a mounting base such as a printed circuit board) as electrically conductive pillars rather than solder bumps, the vertical thickness of the electronic device can be further reduced.

In particular, a thermal decoupling gap may be provided which may be functional both within a horizontal plane and in a vertical direction for thermal isolation of a temperature sensitive component (such as one or more memory chips, one or more multiple image sensors, one or more photonic ICs, etc.) with regard to a heat generating component (for instance a processor). For example, processor heat can be removed by bottom vertical connections and/or plates made of a thermally highly conductive material such as copper. It may be advantageous that a heat sensitive component is mounted at a late stage of the manufacturing process (for instance mounted in accordance with a chip-last-architecture), so as to keep the thermal impact on the heat sensitive component during manufacture as small as possible.

FIG. 1 illustrates a cross-sectional view of an electronic device 100 according to an exemplary embodiment.

The electronic device 100 comprises a first component carrier 102 on a bottom side which may be embodied as an IC (integrated circuit) substrate or as a printed circuit board (PCB). Thus, the first component carrier 102 may be a plate shaped laminate type layer stack 118 composed of a plurality of electrically conductive layer structures 120 and a plurality of electrically insulating layer structures 122. For example, the electrically conductive layer structures 120 may comprise patterned copper structures and vertical through connections, for example copper filled laser vias. The electrically insulating layer structures 122 may comprise a resin (such as epoxy resin) and optionally reinforcing particles therein (for instance glass fibers or glass spheres). For instance, the electrically insulating layer structures 122 may be made of FR4 or ABF. Furthermore, the first component carrier 102 comprises a plurality of electrically unconnected copper-filled vertical through connections 190 functioning for heat removal from a below described second component 110 to a bottom surface of the electronic device 100. Thus, the vertical through connections 190 without electric function and without electric connection to components 108, 110 may serve as thermal through holes filled with a highly thermally conductive material such as copper. The vertical through connections 190 may therefore remove heat from second component 110 towards a bottom region of the electronic device 100 and thereby also suppress undesired heat propagation towards below described components 108.

As shown, a bottom surface of the first component carrier 102 is equipped with a plurality of electrically conductive pillars 136 (for instance copper pillars). At the exposed lower main surface of the first component carrier 102 provided with the pillars 136, an electric connection of the electronic device 100 with a mounting board (not shown, for instance a PCB motherboard) may be enabled in a vertically compact way.

As can be seen in FIG. 1 as well, the first component carrier 102 comprises a central core 150 (for instance made of fully cured material such as FR4) or multilayer structures which is provided on each of the two opposing main surfaces thereof with a respective redistribution layer 137 on an exposed main surface and a further redistribution layer 138 at a main surface facing a second component carrier 104 which is also described below. Descriptively speaking, each of the redistribution layers 137, 138 provides a transition between the smaller dimensions of pads of the various shown components 108, 110, 134 on the one hand and the larger dimensions of the first component carrier 102.

As can be taken from FIG. 1 as well, an upper portion of the electronic device 100 is formed by second component carrier 104 which is vertically connected with the first component carrier 102 by a frame shaped connection body 126 in between. This connection is accomplished in such a way that a thermal decoupling gap 106 is formed between the first component carrier 102 and the second component carrier 104 at a vertical level of the connection body 126. The thermal decoupling gap 106 may be a void region or hollow space or cavity in an interior of the electronic device 100 which is free of solid material, and for instance (but not necessarily) may be filled with air. From a top side, thermal decoupling gap 106 is delimited by a bottom surface of the second component carrier 104. From a bottom side, thermal decoupling gap 106 is delimited by a top surface of the first component carrier 102. Laterally, thermal decoupling gap 106 is delimited by connection body 126. Second component 110 is accommodated in the thermal decoupling gap 106 so that an upper portion and lateral portions, i.e. a circumferential void, of the thermal decoupling gap 106 are maintained.

FIG. 1 also illustrates that first components 108 can be embedded in (or surface mounted on) the second component carrier 104. As shown, the first components 108 may be arranged in a flip chip configuration, or may be connected alternatively with bond wires (not shown). The first components 108 are here embodied as temperature sensitive memory chips. Said first components 108 are embedded in a mold compound 124 of the second component carrier 104. Thus, second component carrier 104 is here embodied as mold package with redistribution layer, but can also comprise another encapsulation material such as a laminated.

Moreover, a second component 110 (here embodied as heat generating processor chip) is provided which has a lower first main surface 112 mounted in the thermal decoupling gap 106 and being mechanically and electrically connected on the first component carrier 102. As shown, a complete opposing upper second main surface 114 as well as complete sidewalls 116 of the second component 110 are exposed with respect to material of the first component carrier 102 and with respect to material of the second component carrier 104. In other words, an air space is provided in the interior of the electronic device 100 thermally decoupling the second main surface 114 of the second component 110 from the second component carrier 104 and thermally decoupling also the sidewalls 116 of the second component 110 from the second component carrier 104. Both second main surface 114 and sidewalls 116 are not covered with material of first component carrier 102 or material of second component carrier 104. By taking this measure, a heat flow from second component 110 to the first components 108 is largely disabled, thereby protecting the temperature sensitive first components 108 from overheating by second component 110 during operation of the electronic device 100. As already mentioned, the first main surface 112 of the second component 110 is mounted on the first component carrier 102. This mounting is accomplished so that pads 152 (alternatively pillars) of the second component 110 are electrically connected to the electrically conductive layer structures 120 of the first component carrier 102.

As mentioned, the electronic device 100 comprises connection body 126 which is connected vertically between the first component carrier 102 and the second component carrier 104 and has a through hole (see reference sign 128 in FIG. 2) for accommodating the second component 110 and laterally delimiting the thermal decoupling gap 106. Connection body 126 serves for providing a z-axis connection and contributes to define thermal decoupling gap 106. For example, electrically insulating material of connection body 126 through which metallic vertical through connections 130 extend may be FR4, glass, ceramic or ABF. The vertical through connections 130 establish an electric connection between the second component carrier 104 and the first component carrier 102, more precisely between the first components 108 and the second component 110.

As shown as well, the connection body 126 comprises vertical through connections 130 electrically coupling the first component 108 with the second component 110. The vertical through connections 130 may be copper filled vias. More specifically, the vertical through connections 130 in connection body 126 are connected to redistribution layer 138 on the top side of the first component carrier 102 and to a further redistribution layer 139 at a bottom side of the second component carrier 104. As a result, an electrically conductive path may be formed from the first components 108 via pads 154 thereof, via said vertical through connections 130, via redistribution layer 138, optionally via electrically conductive layer structures 120 of first component carrier 102, up to the pads 152 of the second component 110.

As an alternative to the provision of connection body 126, the second component carrier 104 may comprise a recess at a bottom side facing the first component carrier 102 for accommodating the second component 110 and delimiting the thermal decoupling gap 106. (not shown). In such an embodiment, first component carrier 102 and second component carrier 104 may be directly connected with each other, i.e. without connection body 126.

Furthermore, one or more third components 134 may be embedded in the first component carrier 102. For example, the third components 134 may be passive components (for instance a capacitor, an inductor, etc.), a power supply controller (for instance for regulating a supply voltage to render it appropriate for components 108, 110), etc. via the redistribution layers 137, 138 and/or other the electrically conductive layer structures 120 of the first component carrier 102, pads 156 of the one or more third components 134 may be electrically coupled with the first and second components 108, 110. By embedding the third components 134 in first component carrier 102 rather than surface mounting them on first component carrier 102, a vertically compact configuration of the electronic device 100 can be achieved.

As shown, an exposed surface of the second electronic component 110 within thermal decoupling gap 106 may be covered with a coating 132. Preferably, the coating 132 may be a thermally highly conductive coating, for instance a sputtered copper layer. Additionally or alternatively, coating 132 may be made of a protective (for instance an anticorrosive) material (such as PTFE) for preventing moisture from reaching the sensitive second electronic component 110.

Preferably, the redistribution layers 137, 138, which may comprise electrically conductive material (preferably copper) and electrically insulating material (for instance epoxy resin or polyimide) may be rich of copper. Advantageously, at least 10 volume percent and preferably at least 50 volume percent of the material of a respective one of the redistribution layers 137, 138 may be copper. Copper has a very high thermal conductivity and may thus efficiently remove heat from the second component 110 (in particular a heat source such as a processor) to a bottom side of the electronic device 100, and thereby away from the thermally sensitive first components 108 (for instance semiconductor memory chips). For this purpose, it is also preferred that one or both of the redistribution layers 137, 138 has an effective thermal conductivity in a horizontal plane according to FIG. 1 in a range from 10 W/mK to 15 W/mK. In a vertical direction according to FIG. 1, said thermal conductivity may be preferably in a range from 3 W/mK to 8 W/mK.

Although not shown, it is also possible that the first component carrier 102—in addition to thermal vertical through connections 190—comprises a further heat removal structure, such as a copper plate, between the first main surface 112 of the second component 110 and an exposed lower main surface of the first component carrier 102 for additionally contributing to the removal of heat from the second component 110.

Referring to a method of manufacturing the electronic device 100 according to FIG. 1, it may be preferred to mount the second component 110 on the first component carrier 102 only directly before connecting the second component carrier 104 with the first component carrier 102 with the connection body 126 in between. With such a chip last manufacturing architecture, it can be ensured that the expensive second component 110 is only mounted on a semifinished structure of the electronic device 100 at a very late stage, so that the yield can be very high. It may also be advantageous to apply the coating 132 of the second component 110 after mounting the second component 110 on the first component carrier 102, for instance by sputtering.

Preferably, the first component carrier 102 and the second component carrier 104 with connection body 126 in between may be connected by thermo-compressing, for instance using a non-conductive film 158 or paste (not shown) in between. This also contributes to a compact vertical configuration. Correspondingly, it is possible to connect the first component carrier 102 and the second component 110 by thermo-compressing, for example using a non-conductive film 158.

Thus, FIG. 1 provides an electronic device 100 configured as integrated stacked IC module. The electronic device 100 has integrated computing or processing capability, see second component 110. The electronic device 100 has also an integrated power supply provided by third components 134, thereby promoting integrated signal stabilization. An integrated and space-saving embodiment is thereby provided for connection between processor type second component 110 and memory type first components 108. In an embodiment, additional functionality (for instance a communication capability, an anti-fraud feature, etc.) may be implemented in electronic device 100 as well. Thermal decoupling gap 106 advantageously serves for providing a thermal separation of second component 110 with respect to first components 108 both in lateral and vertical directions. A sputtered layer may be provided as coating 132 for accomplishing thermal spreading of heat created by second component 110 during operation of the electronic device 100.

Highly advantageously, the thermal decoupling gap 106 ensures a thermal isolation of the memory chips from the processor. Processor heat can be removed by bottom vertical connections (see redistribution layers 137, 138 and electrically conductive layer structures 120) and optionally by one or more copper plates (not shown).

Hence, the embodiment of FIG. 1 provides an electronic device 100 configured to thermally isolate the first components 108 on the top side from the second component 110 on the bottom side and ensures both a lateral and vertical heat removal avoiding undesired heating of the first components 108. Additionally, the electronic device 100 has a reduced vertical height in view of the embedding also of the third components 134 (for instance comprising a power management IC, passive components, etc.).

Figure 2:
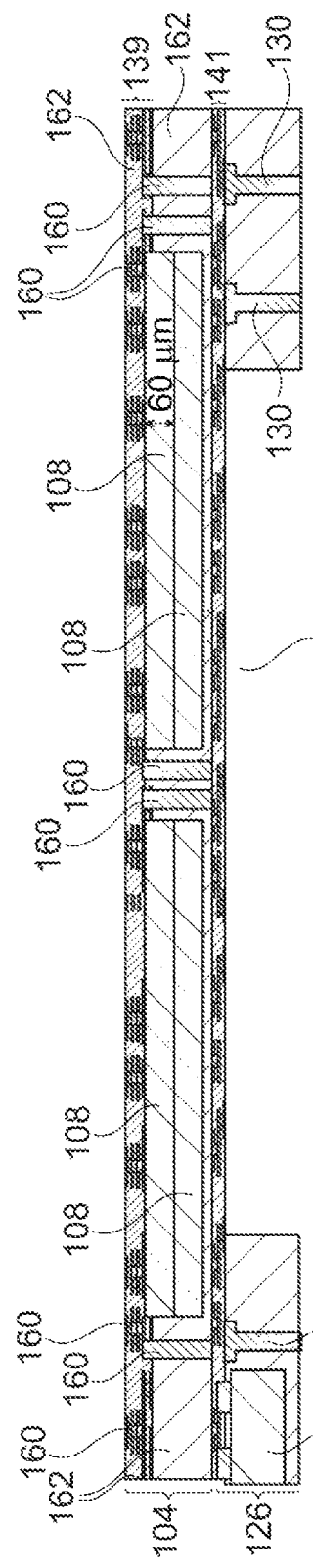
FIG. 2 illustrates a cross-sectional view of a laminated second component carrier with an annular connection body as top portion of an electronic device according to an exemplary embodiment.

FIG. 2 illustrates a cross-sectional view of a laminated second component carrier 104 with an annular connection body 126 as top portion of an electronic device 100 according to an exemplary embodiment.

In the embodiment of FIG. 2, second component carrier 104 comprises stacked configurations of first components 108. More specifically, two memory chips are directly stacked so as to improve the memory performance. FIG. 2 thus relates to an advanced memory package.

Moreover, second component carrier 104 of FIG. 2 is embodied as a purely laminated component carrier (for instance PCB or IC substrate). Thus, the second component carrier 104 according to FIG. 2 may be a plate shaped laminate type layer stack composed of a plurality of electrically conductive layer structures 160 and a plurality of electrically insulating layer structures 162. For example, the electrically conductive layer structures 160 may comprise patterned copper foils and vertical through connections, for example copper filled laser vias. The electrically insulating layer structures 162 may comprise a resin (such as epoxy resin) and optionally reinforcing particles therein (for instance glass fibers or glass spheres). For instance, the electrically insulating layer structures 162 may be made of FR4 or ABF.

Second component carrier 104 moreover has redistribution layers 139, 141 on both opposing main surfaces thereof.

Furthermore, FIG. 2 shows that it is optionally possible to embed at least one fourth component 165 (for instance a passive component such as a capacitor) in frame shaped connection body 126.

Figure 3:
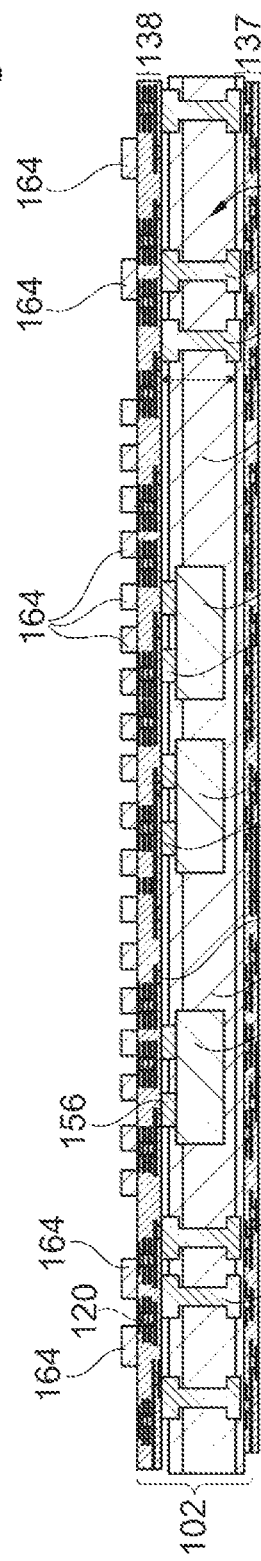
FIG. 3 illustrates a cross-sectional view of a first component carrier with embedded passive components as bottom portion of an electronic device according to an exemplary embodiment.

FIG. 3 illustrates a cross-sectional view of a first component carrier 102 with embedded passive third components 134 as bottom portion of an electronic device 100 according to an exemplary embodiment.

According to FIG. 3, an upper main surface of the first component carrier 102 is equipped with electrically conductive connection elements 164 enabling connection with pads 152 of second component 110 as well as with vertical through connections 130 extending through connection body 126.

Thus, FIG. 3 illustrates an advanced substrate type component carrier 102 with integrated power management provided by at least part of the third components 134.

Figure 4:
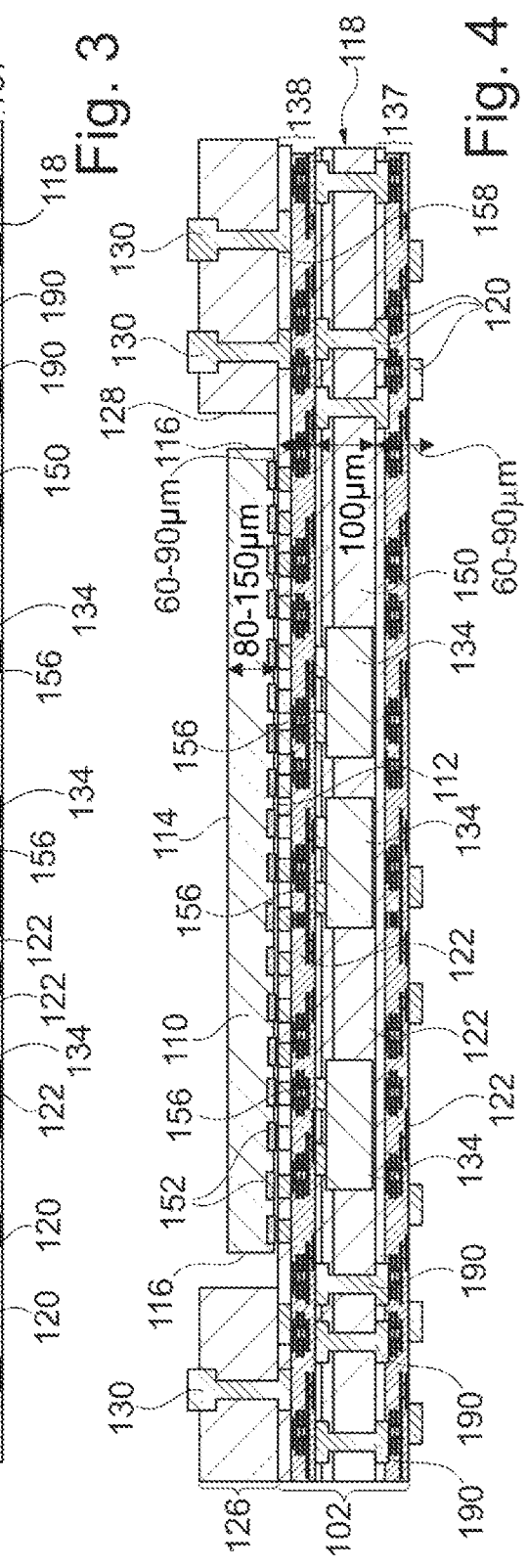
FIG. 4 illustrates a cross-sectional view of a first component carrier with embedded passive components and a component surface mounted thereon as well as an annular connection body as bottom portion of an electronic device according to an exemplary embodiment.

FIG. 4 illustrates a cross-sectional view of a first component carrier 102 with embedded passive third components 134 and a second component 110 surface mounted thereon as well as an annular connection body 126 as bottom portion of an electronic device 100 according to an exemplary embodiment.

FIG. 4 illustrates exemplary vertical dimensions of various constituents and thereby shows that the described manufacturing architecture allows obtaining an electronic device 100 with a high compactness in vertical direction.

Figure 5:
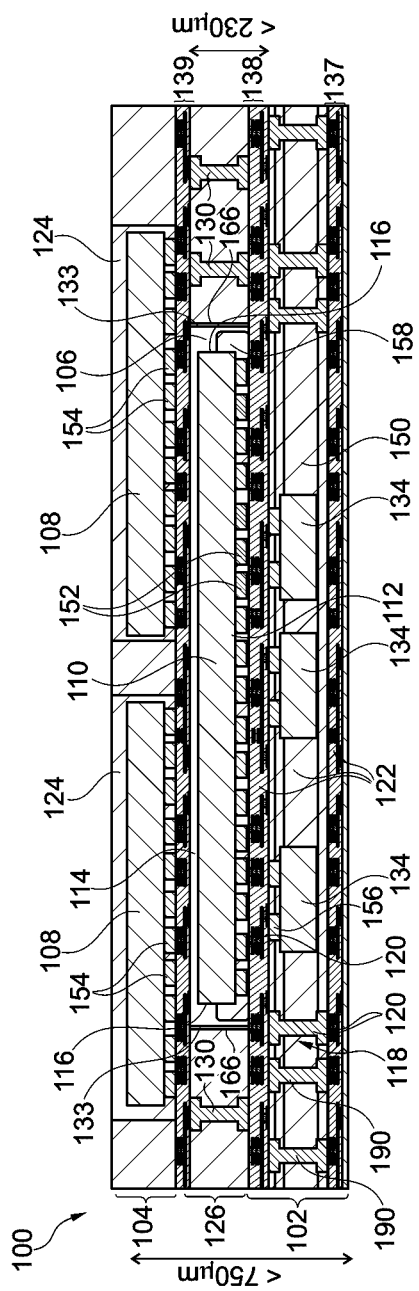
FIG. 5 illustrates a cross-sectional view of an electronic device according to another exemplary embodiment.

FIG. 5 illustrates a cross-sectional view of an electronic device 100 according to another exemplary embodiment.

Also FIG. 5 indicates dimensions of the illustrated electronic device 100 in a vertical direction and thereby shows the highly compact configuration in z-direction.

Moreover, FIG. 5 shows that inner sidewalls 166 of the connection body 126 defining lateral limits of the thermal decoupling gap 106 may be covered with a coating 133. Coating 133 may be provided additionally or alternatively to coating 132 shown in FIG. 1. Preferably, the coating 133 may be made of an anticorrosive material (such as PTFE) for preventing moisture from reaching the sensitive second electronic component 110.

Figure 6:
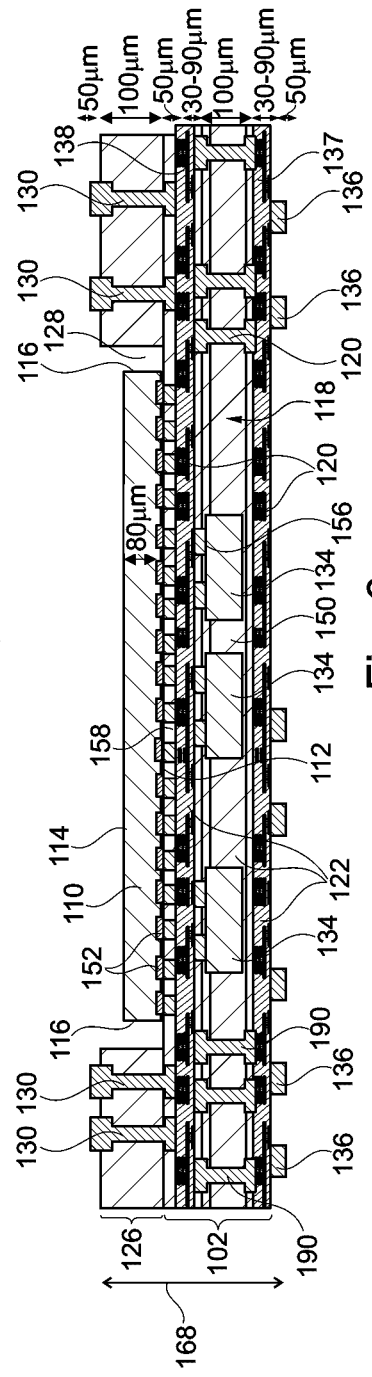
FIG. 6 illustrates a cross-sectional view of a bottom portion of an electronic device according to an exemplary embodiment.

FIG. 6 illustrates a cross-sectional view of a bottom portion of an electronic device 100 according to an exemplary embodiment.

FIG. 6 illustrates in detail the vertical dimensions of the various constituents of the lower part of the electronic device 100. Advantageously, an entire vertical thickness 168 of the lower part of the electronic device 100 shown in FIG. 6 may be quite small (in particular depending on the number of fan-out layers and the implemented manufacturing technology).

FIG. 7 illustrates a cross-sectional view of a bottom portion of an electronic device 100 according to another exemplary embodiment.

In contrast to FIG. 6, a non-conductive film 158 used for thermal compression according to FIG. 6 is omitted in FIG. 7.

FIG. 8 illustrates a cross-sectional view of constituents of an electronic device 100 according to an exemplary embodiment before connection.

FIG. 8 shows that after memory board assembly, non-conductive film 158 may be applied from a backside. FIG. 8 shows a structure obtained after formation of a thermo-compression bond between first component carrier 102 and connection body 126.

FIG. 8 also shows how thermal decoupling gap 106 is formed for providing a thermal isolation of the memory chips (first components 108) from the processor (second component 110). Memory heat can thus be removed by bottom sided vertical connections, see vertical through connections 190 and optionally copper plates (not shown).

FIG. 9 to FIG. 19 illustrate cross-sectional views of structures obtained during carrying out methods of manufacturing electronic devices 100 according to exemplary embodiments.

Referring to FIG. 9, an embodiment of connection body 126 is illustrated as a z-axis connector frame with solder caps 170 for establishing an electrically conductive connection with first component carrier 102. Using said solder caps 170, the connection body 126 may hence be bonded on top of first component carrier 102 with the embedded third components 134 on a bottom side.

The PCB or IC substrate type constituents 102, 126 may be manufactured and processed on a panel level.

Referring to FIG. 10, a result of the connection of first component carrier 102 with connection body 126 of FIG. 9 is shown. This connection may be accomplished by mass reflow soldering (for instance at a temperature of 250° C.).

FIG. 11 shows how processor type second component 110 is prepared for being connected with solder bumps or copper pillars provided as part of the electrically conductive layer structures 120 on top of first component carrier 102. It is possible that the second component 110, at its bottom side, is provided with solder caps and/or non-conducting film 158. Thereafter, the second component 110 may be bonded to the copper pillars on top of substrate type first component carrier 102 by thermo-compression bonding. FIG. 12 shows the result of this bonding process.

FIG. 13 illustrates a coating 132 applied to exposed surface portions of second component 110 and connection body 126. For instance, the coating 132 may be a deposit moisture barrier layer which may for instance be applied by chemical vapor deposition (CVD) or physical vapor deposition (PVD).

Referring to FIG. 14, molded second component carrier 104, which may be prefabricated, may be approached to the structure obtained after carrying out the process described referring to FIG. 13.

Referring to FIG. 15, a first body composed of already connected first component carrier 102 and connection body 126, and a second body in form of second component 110 are shown before bonding (for instance before formation of a thermo-compression bond).

Referring to FIG. 16, pre-fabricated molded second component carrier 104 is shown in addition to the bodies illustrated in FIG. 15.

Referring to FIG. 17, a result of bonding (for instance thermo-compression bonding) of second component 110 on first component carrier 102 is illustrated.

Referring to FIG. 18, an embodiment is shown in which the (for instance processor type) second component 110 is fully encapsulated by a (for instance mold type) coating 132. In this embodiment, coating 132 may be used for bonding (for instance thermo-compression bonding) and provides a molded underfill.

FIG. 19 illustrates a pre-form of an electronic device 100 before formation of a thermo-compression bond between connection body 126 and second component carrier 104.

FIG. 20 illustrates simulation results of an electronic device 100 according to an exemplary embodiment and shows improved thermal decoupling between first components 108 in a second component carrier 104 and another second component 110 in a thermal decoupling gap 106 on a first component carrier 102.

FIG. 20 shows a plan view of an electronic device 100 according to an exemplary embodiment with two memory type first components 108 above a processor type second component 110. Reference sign 180 indicates a cutting line for obtaining the three cross-sectional views shown on the right-hand side of FIG. 20. Said three cross-sectional views correspond to simulation results for simulating the effect of the provision of a thermal decoupling gap 106, as described above. Moreover, the simulation results provide information concerning the effect of different thermal conductivities below second component 110.

As shown in a first cross-section 182, a simulation of the heat distribution around second component 110 is illustrated in a scenario without a thermal decoupling gap. A thermal conductivity of a homogenized or averaged redistribution layer of 4 W/mK in a vertical direction and 15 W/mK in each horizontal direction has been assumed. The result of the simulation is a relatively small temperature difference at the position of the second component 110 as compared to a position of the first components 108 of 35 K. A maximum temperature of the memory type first electronic components 108 was 76° C., which is quite high. This simulation result shows that, in the absence of a thermal decoupling gap, there is a risk of a significant heat transfer from second component 110 to first components 108.

As shown in a second cross-section 184, a simulation of the heat distribution around second component 110 is illustrated again without thermal decoupling gap. A thermal conductivity of a redistribution layer of 4 W/mK in a vertical direction and 10 W/mK in each horizontal direction has been assumed. A maximum temperature of the memory type first electronic components 108 was 77° C.

As shown in a third cross-section 186, a simulation of the heat distribution around second component 110 is illustrated with thermal decoupling gap 106, compare for instance FIG. 1. A thermal conductivity of the redistribution layer of 4 W/mK in a vertical direction and 15 W/mK in each horizontal direction has been assumed. The result of the simulation is a temperature difference at the position of the second component 110 as compared to a position of the first components 108 of a significantly larger value of 65 K. A maximum temperature of the memory type first electronic components 108 was only 60° C. The temperature of the more temperature robust second component 110 was somewhat higher than without thermal decoupling gap 106, but still in an acceptable range.

Comparing the first cross-section 182 with the third cross-section 186, the simulation result shows a much higher temperature difference between top and bottom package with thermal decoupling gap 106. Thus, although the temperature of the (more temperature resistant) second component 110 is a bit higher in the third cross-section 186, the temperature of the more temperature sensitive first components 108 is significantly lower in the third cross-section 186 as compared to the first cross-section 182.

A comparison of second cross-section 184 with first cross-section 186 in relation to a comparison of the third cross-section 186 with first cross-section 182 shows that the thermal decoupling gap 106 has an even larger positive influence than the thermal conductivity of the redistribution layers. However, increasing the thermal conductivity of the redistribution layers may nevertheless have a positive impact on the temperature of the second component 110.

Concluding, providing thermal decoupling gap 106 is highly advantageous for protecting first components 108 from overheating. Increasing thermal conductivity of redistribution layers 137, 138 also has a positive, but quantitatively smaller, impact on cooling of second component 110.

Figure 21:
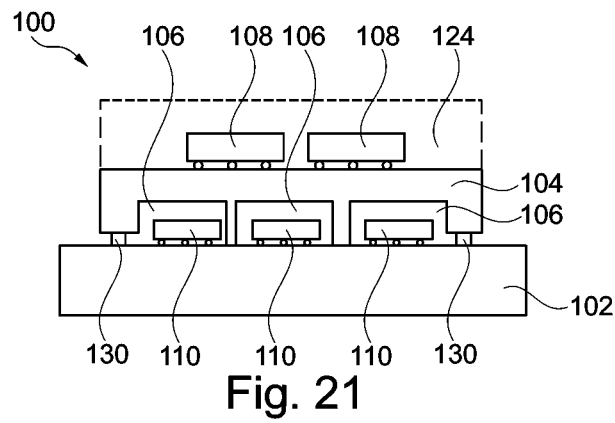
FIG. 21 and FIG. 22 illustrate cross-sectional views of electronic devices according to other exemplary embodiments.
Figure 22:
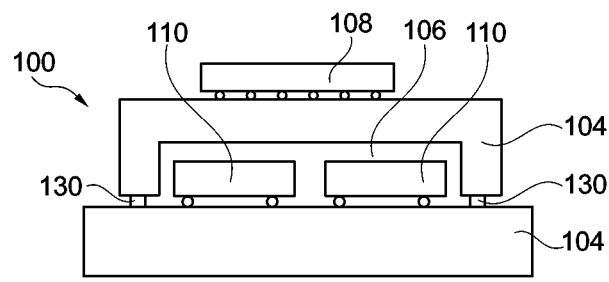

FIG. 21 and FIG. 22 illustrate cross-sectional views of electronic devices 100 according to other exemplary embodiments.

Referring to FIG. 21, a dashed line indicates that one or more first components 108 can either be surface mounted on the second component carrier 104 or can be embedded within a mold compound 124 or the like in an upper portion of the second component carrier 104. Two first components 108 are illustrated in FIG. 21.

FIG. 21 also shows that multiple cavities or thermal decoupling gaps 106 may be formed between the first component carrier 102 and the second component carrier 104, each for accommodating one or multiple second components 110. Three thermal decoupling gaps 106 are shown in FIG. 21, each accommodating one second component 110.

Referring to FIG. 22, an embodiment is shown in which a first component 108 is mounted on the second component carrier 104 to thereby be exposed to an environment. Such an embodiment may for instance be advantageous when the first component 108 is a light-sensitive sensor. Since light-sensitive sensors are prone to failure in the event of overheating, it is advantageous that the (here two) second components 110 in the thermal decoupling gap 106 are thermally decoupled from the surface mounted first component 108, as described above.

The first component 108 can also be configured as a lens and/or any other optical element. It is also possible that a lens or any other optical element is mounted on the first component 108, in particular when embodied as light-sensitive sensor. It is furthermore possible that the first component 108 comprises or is connected to a waveguide such as a light fiber (not shown).

Figures 23, 24, 25:
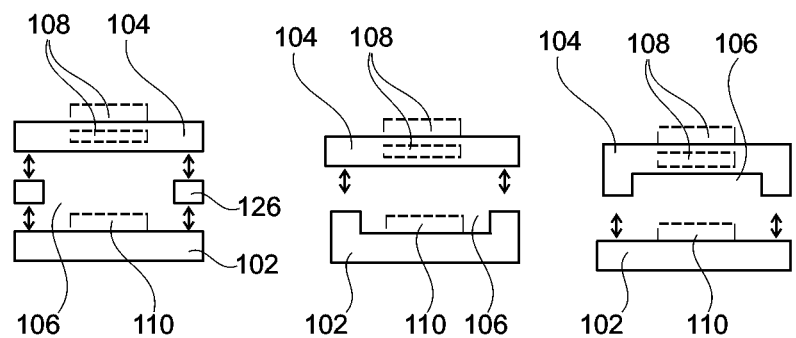
FIG. 23, FIG. 24 and FIG. 25 illustrate cross-sectional views of constituents of electronic devices according to exemplary embodiments and illustrate schematically manufacturing methods thereof.

FIG. 23 to FIG. 25 illustrate cross-sectional views of constituents of module-type electronic devices 100 according to exemplary embodiments and illustrate schematically manufacturing methods thereof. Three different concepts may be applied for manufacturing an electronic device 100 according to an exemplary embodiment of the invention.

Referring to FIG. 23, thermal decoupling gap 106 may be formed by sandwiching a connection body 126, having an opening, between first component carrier 102 and second component carrier 104. One or more functional elements may be integrated in and/or guided through the connection body 126. For instance, it is possible to provide a waveguide at least partially extending through connection body 126 so as to transmit an optical signal, for example between the first component carrier 102 (or its second component 110) and the second component carrier 104 (or its first component 108).

Referring to FIG. 24, thermal decoupling gap 106 may be formed connecting a recessed first component carrier 102 with a planar second component carrier 104.

Referring to FIG. 25, thermal decoupling gap 106 may be formed connecting a planar first component carrier 102 with a recessed second component carrier 104.

In the above-described embodiments, the first component(s) 108 on and/or in the second component carrier 104 has been described as temperature sensitive element, whereas the second component(s) 110 in the thermal decoupling gap 106 has been described as heat generating element. However, in other exemplary embodiments, said functions may be inverted, i.e. the first component(s) 108 on and/or in the second component carrier 104 can be the heat generating element(s), whereas the second component(s) 110 in the thermal decoupling gap 106 can be the temperature sensitive element(s) which is protected by a thermal decoupling from the heat generating element(s).

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. An electronic device, comprising:
    a first component carrier;
    a second component carrier connected with the first component carrier so that a thermal decoupling gap is formed between the first component carrier and the second component carrier;
    a first component on and/or in the second component carrier;
    a second component having a first main surface at which the second component is mounted in the thermal decoupling gap so that at least part of an opposing second main surface and an entire sidewall of the second component is exposed with respect to material of the first component carrier and with respect to material of the second component carrier; and
    a third component in the first component carrier, the first component carrier having a build-up structure surrounding a core layer and a redistribution layer, a first surface of the redistribution layer facing the second component and an opposed surface of the redistribution layer facing the third component,
    wherein respective connections provided by the first surface and the opposed surface are offset,
    wherein the first component carrier comprises vertical through connections configured for removing heat away from the first component and from the second component toward a bottom side of the electronic device.

2. The electronic device according to claim 1, further comprising:
    a fourth component embedded in a connection body connected between the first and second component carriers and having an opening accommodating at least a portion of the second component and delimiting the thermal decoupling gap.

3. The electronic device according to claim 2, further comprising:
    a non-conductive film connected between the first component carrier and the connection body and having an opening at least partially accommodating the second component and delimiting the thermal decoupling gap.

4. The electronic device according to claim 3, wherein the connection body comprises at least one vertical through connection filled with an electrically conductive material and electrically coupling the first component with the first component carrier.

5. The electronic device according to claim 3, wherein the third component comprises at least one of a passive component and a power supply controller.

6. The electronic device according to claim 2, wherein the fourth component comprises a passive or an active component.

7. The electronic device according to claim 1, wherein the first component carrier comprises a connected, laminated, stack comprising at least one electrically conductive layer structure and/or at least one electrically insulating layer structure;
    wherein the redistribution layer has a homogenized or an averaged thermal conductivity in a horizontal plane in a range from 5 W/mK to 20 W/mK.

8. The electronic device according to claim 1, wherein the first component is embedded or surface mounted.

9. The electronic device according to claim 1, wherein the second component carrier comprises a connected, laminated, stack comprising at least one electrically conductive layer structure and/or at least one electrically insulating layer structure, wherein the first component is embedded in or surface mounted on the stack.

10. The electronic device according to claim 1, wherein the entire second main surface of the second component is exposed with respect to material of the first component carrier and with respect to material of the second component carrier.

11. The electronic device according to claim 1, wherein at least one of the first component and the second component is a semiconductor chip.

12. The electronic device according to claim 1, wherein the first component is a memory chip or a sensor chip.

13. The electronic device according to claim 1, wherein the second component is a processor chip.

14. The electronic device according to claim 1, wherein the second component carrier comprises a recess at a side facing the first component carrier for at least partially accommodating the second component and delimiting the thermal decoupling gap.

15. The electronic device according to claim 1, wherein the first component carrier comprises at least one electrically unconnected vertical through connection filled with a thermally conductive material;
 wherein the redistribution layer has a homogenized or an averaged thermal conductivity in a vertical direction in a range from 2 W/mK to 10 W/mK.

16. The electronic device according to claim 1, further comprising:
 a coating at least partially coating at least one of the group consisting of an exposed surface of the second component, and
 a thermal decoupling gap delimiting sidewalls of a connection body connecting the first component carrier with the second component carrier.

17. The electronic device according to claim 16, wherein the coating comprises a thermally highly conductive anti-corrosive coating.

18. The electronic device according to claim 1, further comprising at least one of the following features:
 wherein the first component carrier comprises at least one pillar at an exposed main surface for providing an exterior electric connection of the electronic device;
 wherein the redistribution layer has a volume percentage of copper of at least 50 volume percent;
 wherein the first component carrier comprises a heat removal structure between the first main surface of the second component and an exposed main surface of the first component carrier for removing heat from the second component through the exposed main surface of the first component carrier;
 wherein the second component carrier comprises at least one further first component, wherein the first component and the at least one further first component are arranged according to at least one fashion of the group consisting of a side-by-side fashion, and a vertically stacked fashion;
 wherein at least one of the first component and the second component is selected from a group consisting of an electronic component, an electrically non-conductive and/or electrically conductive inlay, a heat transfer unit, a light guiding element, an optical element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
 wherein at least one electrically conductive layer structure of at least one of the first component carrier and the second component carrier comprises at least one of the group consisting of copper, aluminum, nickel, silver, gold, palladium, and tungsten;
 wherein at least one electrically insulating layer structure of at least one of the first component carrier and the second component carrier comprises at least one of the group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
 wherein at least one of the first component carrier and the second component carrier is shaped as a plate;
 wherein at least one of the first component carrier and the second component carrier is configured as one of the group consisting of a printed circuit board, and a substrate;
 wherein at least one of the first component carrier and the second component carrier is configured as a laminate-type component carrier.

19. A method of manufacturing an electronic device, the method comprising:
 providing a first component carrier with vertical through connections configured for removing heat toward a bottom side of the electronic device, the first component carrier having a build-up structure surrounding a core layer and a redistribution layer;
 providing a second component carrier with a first component on and/or in the second component carrier,
 mounting a first main surface of a second component to the redistribution layer so that an opposing second main surface and an entire sidewall of the second component is exposed with respect to material of the first component carrier; and
 connecting the second component carrier with the first component carrier so that a thermal decoupling gap is formed between the first component carrier and the second component carrier;
 wherein a third component is located in the first component carrier such that a first surface of the redistribution layer faces the second component and an opposed surface of the redistribution layer faces the third component,
 wherein respective connections provided by the first surface and the opposed surface are offset.

20. The method according to claim 19, further comprising at least one of the following features:
 wherein the redistribution layer comprises a volume percentage of copper of at least 50 volume percent;
 wherein the method comprises arranging the redistribution layer with a homogenized or averaged thermal conductivity in a horizontal plane in a range from 5 W/mK to 20 W/mK;

wherein the method comprises arranging the redistribution layer with a homogenized or averaged thermal conductivity in a vertical direction in a range from 2 W/mK to 10 W/mK;

wherein the method comprises mounting the first main surface of the second component on the first component carrier before connecting the first component carrier with the second component carrier;

wherein the method comprises coating the second component with a coating after mounting the second component on the first component carrier, wherein the method comprises coating the second component by sputtering;

wherein the method comprises connecting the first component carrier and the second component carrier with a connection body in between, by thermo-compressing;

wherein the method comprises connecting the first component carrier and the second component by thermo-compressing.

* * * * *